US012652014B2

(12) United States Patent
Gittemeier et al.

(10) Patent No.: US 12,652,014 B2
(45) Date of Patent: Jun. 9, 2026

(54) COMBINER/SPLITTER

(71) Applicant: Qorvo US, Inc., Greensboro, NC (US)

(72) Inventors: Timothy M. Gittemeier, Plano, TX (US); Michael Roberg, Evergreen, CO (US)

(73) Assignee: Qorvo US, Inc., Greensboro, NC (US)

( * ) Notice: Subject to any disclaimer, the term of this patent is extended or adjusted under 35 U.S.C. 154(b) by 398 days.

(21) Appl. No.: 18/061,210

(22) Filed: Dec. 2, 2022

(65) Prior Publication Data

US 2023/0231532 A1    Jul. 20, 2023

Related U.S. Application Data

(60) Provisional application No. 63/301,123, filed on Jan. 20, 2022.

(51) Int. Cl.
| | |
|---|---|
| *H03H 7/48* | (2006.01) |
| *H01P 5/16* | (2006.01) |
| *H04B 1/40* | (2015.01) |

(52) U.S. Cl.
CPC .............. *H03H 7/487* (2013.01); *H01P 5/16* (2013.01); *H04B 1/40* (2013.01)

(58) Field of Classification Search
CPC .. H03H 7/487; H03H 2001/0078; H03H 7/09; H03H 7/48; H01P 5/16; H01P 5/12; H04B 1/40
USPC .......................................................... 455/73
See application file for complete search history.

(56) References Cited

U.S. PATENT DOCUMENTS

| | | | |
|---|---|---|---|
| 4,724,602 A | 2/1988 | Weissman | |
| 4,810,904 A * | 3/1989 | Crawford .............. | H03L 7/1077 327/33 |
| 10,438,732 B2 | 10/2019 | Roberg | |
| 2009/0085666 A1 | 4/2009 | Ohnishi et al. | |
| 2010/0091521 A1 | 4/2010 | Hinds et al. | |
| 2012/0314734 A1 | 12/2012 | Zierdt | |
| 2013/0234669 A1* | 9/2013 | Huang ................ | H02J 7/00302 320/126 |
| 2013/0241308 A1 | 9/2013 | Bilbrey et al. | |
| 2014/0253246 A1 | 9/2014 | Mei | |
| 2017/0076855 A1* | 3/2017 | Roberg .................. | H01F 19/04 |

(Continued)

OTHER PUBLICATIONS

Boulouard, Andre et al., "Analysis of Rectangular Spiral Transformers for MMIC Applications," IEEE Transactions on Microwave Theory and Techniques, vol. 37, No. 8, Aug. 1989, pp. 1257-1260.

(Continued)

*Primary Examiner* — Eugene Yun
(74) *Attorney, Agent, or Firm* — Withrow & Terranova, P.L.L.C.

(57) ABSTRACT

A combiner/splitter is disclosed having a first trifilar transformer having a first outer transmission element electrically connected between a first port node and a first intermediate node. A second trifilar transformer has a second outer transmission element electrically connected between the first intermediate node and a second port node. A third trifilar transformer has a third outer transmission element electrically connected between the first port node and a second intermediate node. A fourth trifilar transformer has a fourth outer transmission element electrically connected between the second intermediate node and a third port node.

23 Claims, 5 Drawing Sheets

(56) References Cited

U.S. PATENT DOCUMENTS

| | | | | |
|---|---|---|---|---|
| 2019/0235050 A1* | 8/2019 | Maligeorgos | ........... | G01S 7/032 |
| 2023/0030569 A1* | 2/2023 | Kim | ........................ | H03H 7/48 |

OTHER PUBLICATIONS

Scardelletti, M.C. et a., ""Miniaturized Wilkinson Power Dividers Utilizing Capacitive Loading,"" IEEE Microwave and Wireless Components Letters, vol. 12, Issue 1, Jan. 2002, IEEE, 3 pages.
Winslow, Thomas A., "Ultra broadband MMIC impedance transformer," Proceedings of the 41st European Microwave Conference, Oct. 10-13, 2011, Manchester, UK, IEEE, pp. 854-857.
Non-Final Office Action for U.S. Appl. No. 15/141,296, mailed Dec. 5, 2018, 12 pages.
Final Office Action for U.S. Appl. No. 15/141,296, mailed Mar. 20, 2019, 13 pages.
Advisory Action for U.S. Appl. No. 15/141,296, mailed Apr. 15, 2019, 3 pages.
Notice of Allowance and Applicant-Initiated Interview Summary for U.S. Appl. No. 15/141,296, mailed May 29, 2019, 10 pages.

* cited by examiner

COMBINER/SPLITTER

FIELD OF THE DISCLOSURE

The present disclosure relates to combiners/splitters and in particular to broadband power combiners/splitters that are fabricated into integrated circuits.

BACKGROUND

Radio frequency (RF) power combiners and RF power splitters, including microwave power combiners/splitters, are used extensively in RF and microwave communications systems. Several types of traditional power combiners/splitters such as Wilkinson-type power combiners/splitters are available. However, such traditional power combiners/splitters are lacking in one or more desirable fifth-generation (5G) attributes that include, but are not limited to, smaller size, greater bandwidth, and higher power handling. Thus, there remains a need for power combiners/splitters that meet newer and more desirable 5G attributes.

SUMMARY

A combiner/splitter is disclosed having a first trifilar transformer having a first outer transmission element electrically connected between a first port node and a first intermediate node. A second trifilar transformer has a second outer transmission element electrically connected between the first intermediate node and a second port node. A third trifilar transformer has a third outer transmission element electrically connected between the first port node and a second intermediate node. A fourth trifilar transformer has a fourth outer transmission element electrically connected between the second intermediate node and a third port node The present combiner/splitter employs the four trifilar transformers and at least one resistor to create a broadband combiner/splitter with high insolation. As disclosed, the combiner/splitter is an in-phase power combiner/splitter that has low insertion loss and high power handling. The combiner/splitter has excellent phase and magnitude balance across wide bandwidth. A die on which the combiner/splitter is fabricated may have a relatively compact size using flip chip or bond wires to combine two power amplifiers in a package.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
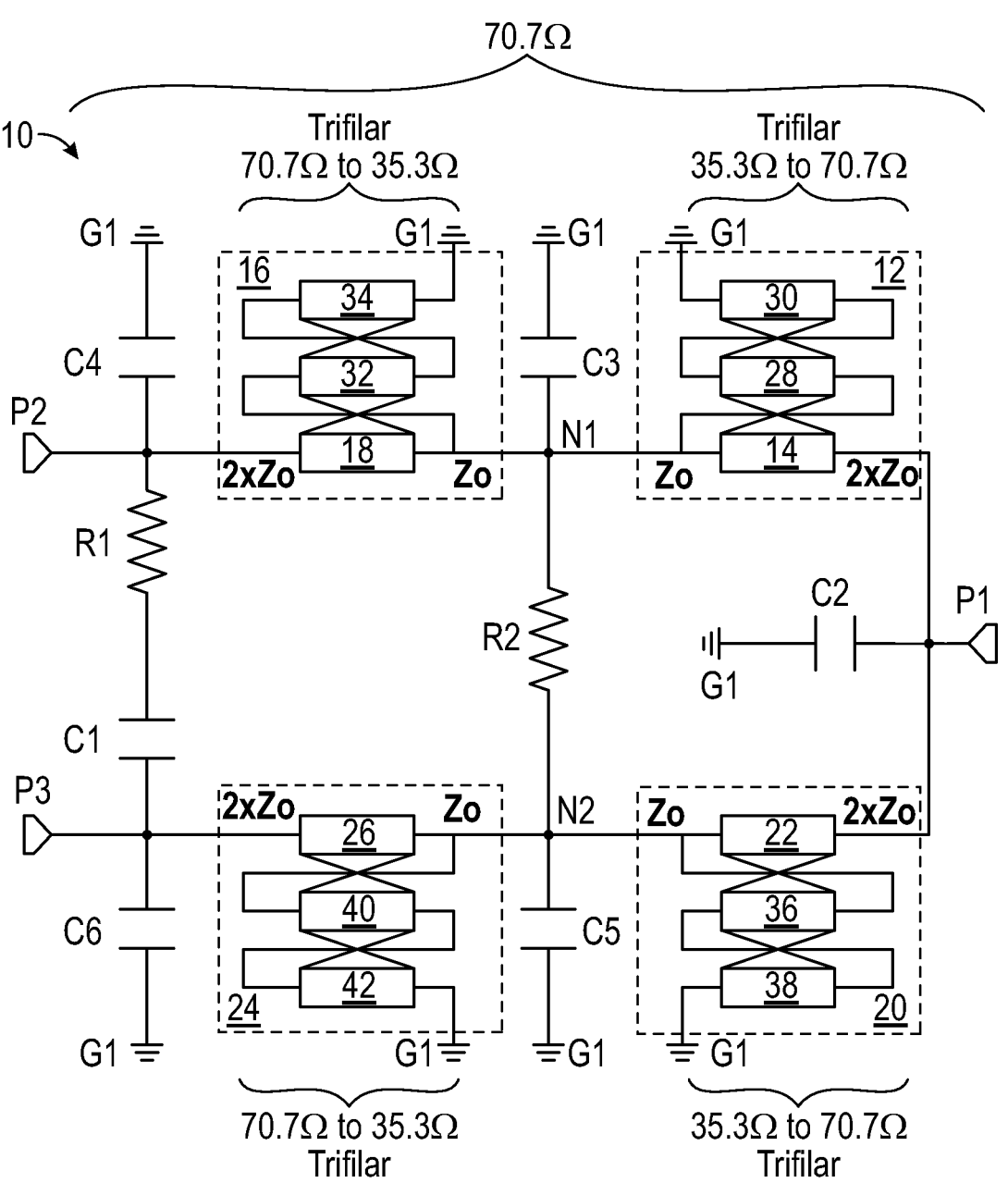
FIG. 1 is a schematic of an exemplary embodiment of a combiner/splitter that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a schematic of an exemplary embodiment of a combiner/splitter 10, having a first trifilar transformer 12 having a first outer transmission element 14 electrically connected between a first port node P1 and a first intermediate node N1. A second trifilar transformer 16 has second outer transmission element 18 electrically connected between the first intermediate node N1 and a second port node P2. A third trifilar transformer 20 has a third outer transmission element 22 electrically connected between the first port node P1 and a second intermediate node N2. A fourth trifilar transformer 24 has a fourth outer transmission element 26 electrically connected between the second intermediate node N2 and a third port node P3.

The first trifilar transformer 10 has a first middle transmission element 28 and a first inner transmission element 30 that are electrically connected in series between the first intermediate node N1 and a fixed voltage node G1. The first middle transmission element 28 is arranged relative to the first outer transmission element 14 to magnetically couple with the first outer transmission element 14, and the first inner transmission element 30 is arranged relative to the first middle transmission element 28 to magnetically couple with the first middle transmission element 28.

The second trifilar transformer 16 has a second middle transmission element 32 and a second inner transmission element 34 that are electrically connected in series between the first intermediate node N1 and the fixed voltage node G1. The second middle transmission element 32 is arranged relative to the second outer transmission element 18 to magnetically couple with the second outer transmission element 18, and the second inner transmission element 34 is arranged relative to the second middle transmission element 32 to magnetically couple with the second middle transmission element 32.

The third trifilar transformer 20 has a third middle transmission element 36 and a third inner transmission element 38 that are electrically connected in series between the second intermediate node N2 and the fixed voltage node G1. The third middle transmission element 36 is arranged relative to the third outer transmission element 22 to magnetically couple with the third outer transmission element 22, and the third inner transmission element 38 is arranged relative to the third middle transmission element 36 to magnetically couple with the third middle transmission element 36.

The fourth trifilar transformer 20 has a fourth middle transmission element 40 and a fourth inner transmission element 42 that are electrically connected in series between the second intermediate node N2 and the fixed voltage node G1. The fourth middle transmission element 40 is arranged relative to the fourth outer transmission element 26 to magnetically couple with the fourth outer transmission element 26, and the fourth inner transmission element 42 is arranged relative to the fourth middle transmission element 40 to magnetically couple with the fourth middle transmission element 40.

A first resistor R1 and a first capacitor C1 are electrically connected in series between the second port node P2 and the third port node (P3). The first resistor R1 and the first capacitor provide high isolation between the second port node P2 and the third port node P3. In the exemplary embodiment depicted in FIG. 1, a second resistor R2 is electrically connected between the first intermediate node N1 and the second intermediate node N2 to provide further isolation between a first signal path that carries radio frequency (RF) signals between the first port node P1 and the second port node P2 and a second signal path that carries RF signals between the first port node P1 and the third port node P3. A second capacitor C2 is electrically connected between the first port node P1 and the fixed voltage node G1. A third capacitor C3 is electrically connected between the first intermediate node N1 and the fixed voltage node G1. A fourth capacitor C4 is electrically connected between the second port node P2 and the fixed voltage node G1. A fifth capacitor C5 is electrically connected between the second intermediate node N2 and the fixed voltage node G1. A sixth capacitor C6 is electrically connected between the third port node P3 and the fixed voltage node G1. Each of the capacitors C2-C6 improves return loss for the splitter/combiner 10. The fixed voltage node G1 depicted in FIG. 1 is at ground potential.

Figure 2:
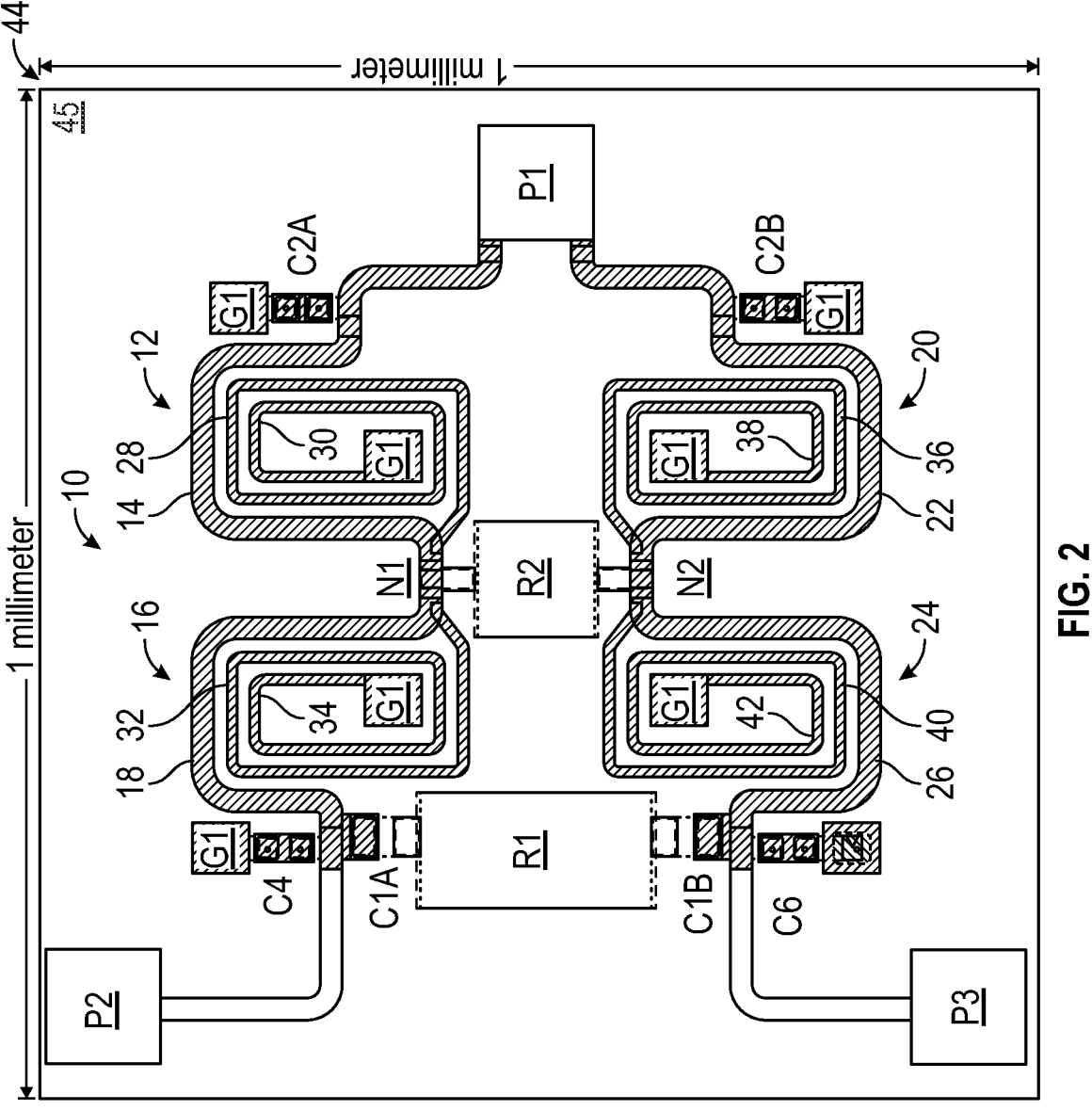
FIG. 2 is a diagram depicting a layout for an integrated circuit die of an exemplary embodiment of the combiner/splitter 10 that is structured in accordance with the present disclosure.

FIG. 2 is a diagram depicting a layout for an integrated circuit die 44 of an exemplary embodiment of the combiner/splitter 10 structured in accordance with the present disclosure. The exemplary integrated circuit die 44 includes a substrate 45 onto which the combiner/splitter 10 is fabricated. The exemplary substrate 45 is 1 millimeter by 1 millimeter. Materials for the substrate 45 may include but are not limited to semiconductor materials such as gallium nitride, alumina, and printed circuit board substrate materials. In the exemplary embodiment depicted in FIG. 2, the first capacitor C1 depicted symbolically in FIG. 1 is split into two physical capacitors C1A and C1B. Similarly, the second capacitor C2 depicted symbolically in FIG. 1 is split into two physical capacitors C2A and C2B as shown in FIG. 2. The exemplary embodiment depicted in FIG. 2 does not show the third capacitor C3 and the fifth capacitor C5 which are shown symbolically in FIG. 1, but the third capacitor C3 may be electrically connected between the first node N1 and the ground node G1, and the fifth capacitor C5 may be added between the second node N2 and the ground node G1.

Conductive lines making up the outer transmission elements 14, 18, 22, and 26 may be at least 20 micrometers wide. The middle transmission elements 28, 32, 36, and 40 and the inner transmission elements 30, 34, 38, and 42 may be less wide than the outer transmission elements 14, 18, 22, and 26. Moreover, the trifilar transformers may be fabricated from standard metal layers such as M0/MIM/M1/M2/MX2. The resistors R1 and R2 may be fabricated to be 100 micrometers wide for power handling.

The combiner/splitter 10 is usable for wideband RF signal combining and splitting. The combiner/splitter 10 provides higher isolation that is greater than 15 dB across 20 GHz of bandwidth. Moreover, the combiner/splitter 10 provides low insertion loss that is less than 0.6 dB across 20 GHz of bandwidth. The combiner/splitter 10 substantially maintains zero phase and magnitude imbalance across 20 GHz of bandwidth. Electrostatic discharge protection is grounded through a via to ground G1. The combiner/splitter 10 may be bumped and mounted on a laminate, thereby avoiding bond wire inductance.

Figure 3:
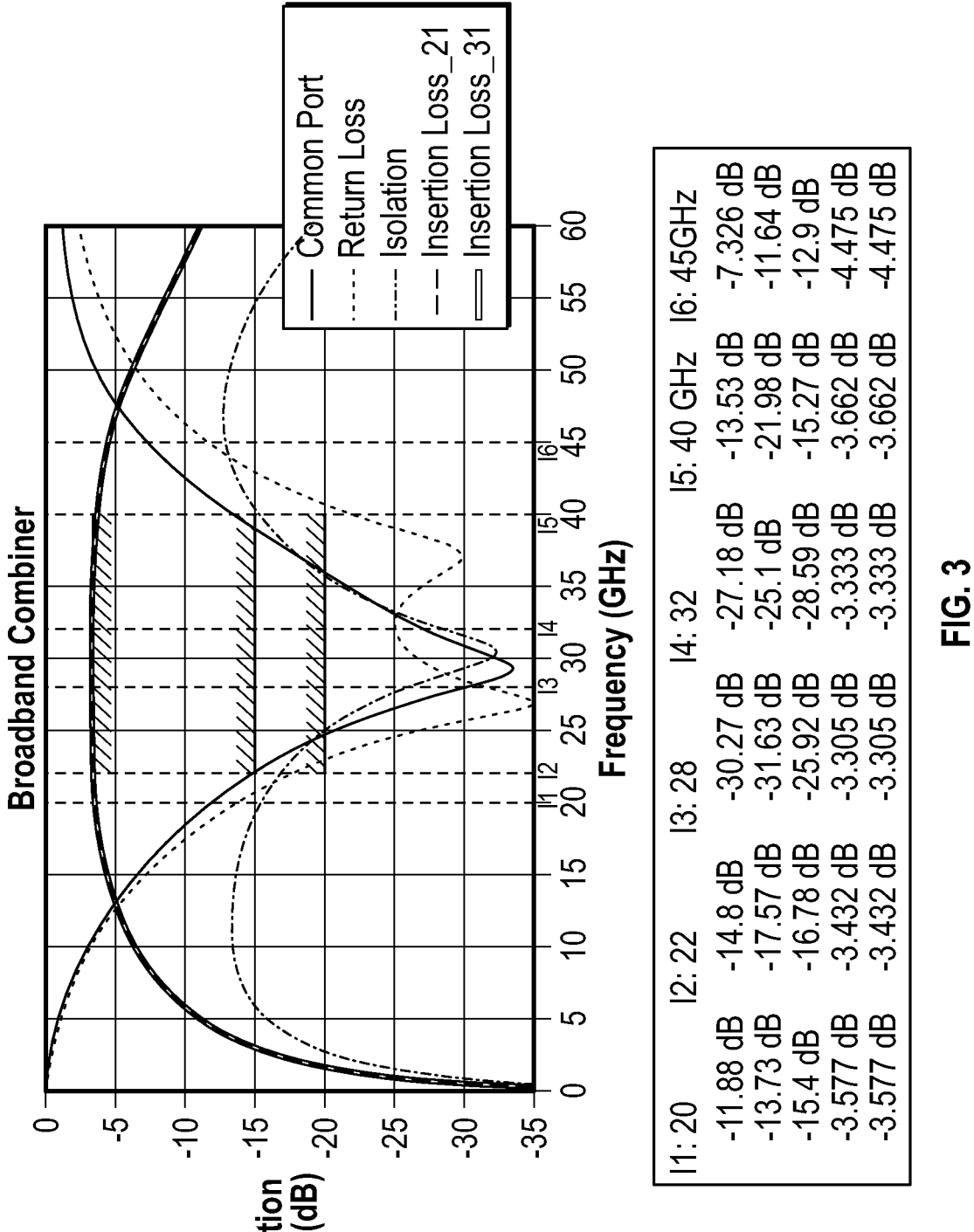
FIG. 3 is a graph depicting losses and isolation versus frequency for the combiner/splitter.
Figure 4:
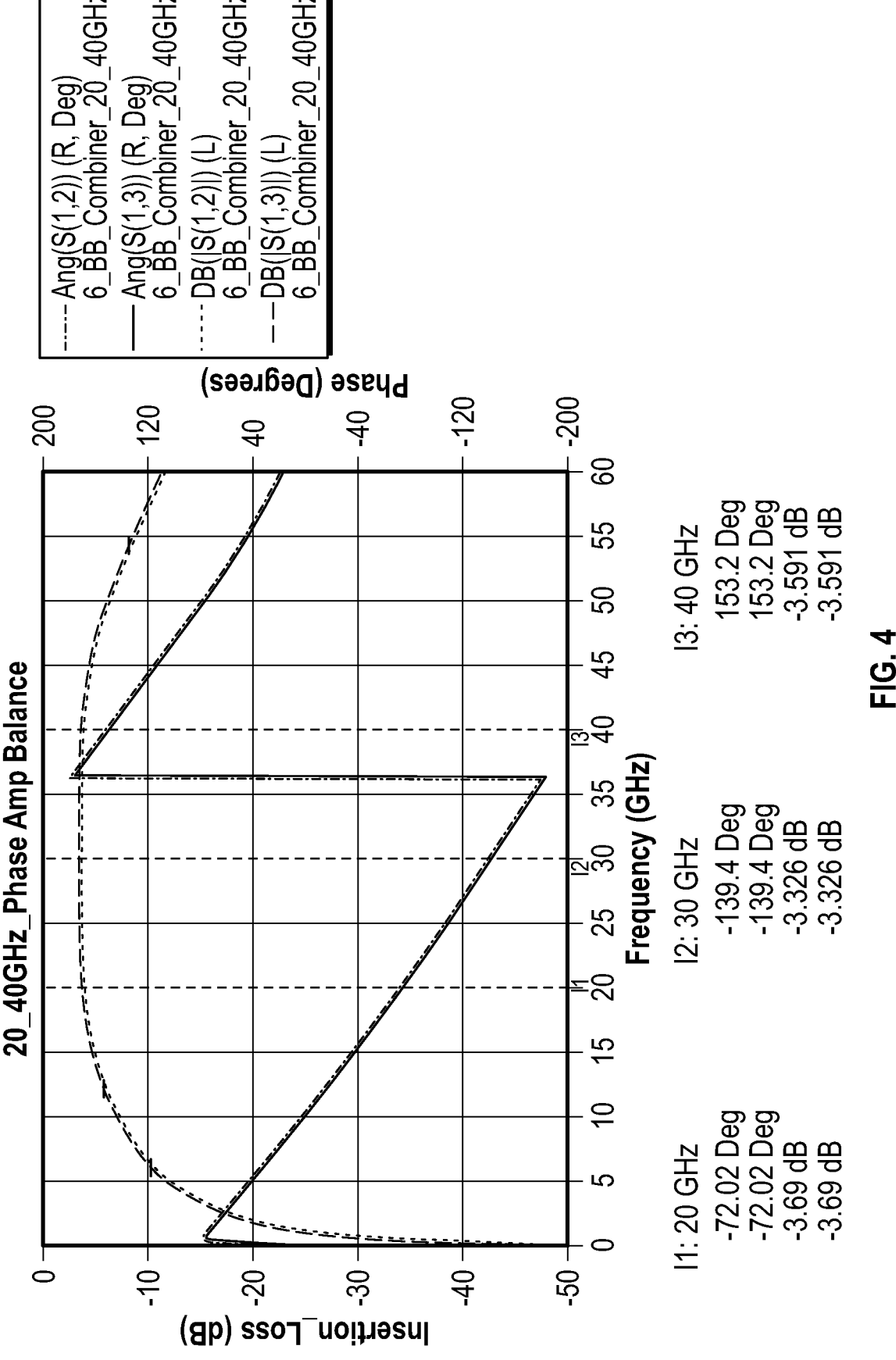
FIG. 4 is a graph depicting losses and phase angle versus frequency for the combiner/splitter.

FIG. 3 is a graph depicting losses and isolation versus frequency for the combiner/splitter 10. Note that the combiner/splitter 10 provides greater than 25 dB isolation from 28 GHz to 32 GHz. Also notice that the combiner/splitter 10 has no more than 0.3 dB loss from 28 GHz to 32 GHz. FIG. 4 is a graph depicting losses and phase angle versus frequency for the combiner/splitter 10.

Figure 5:
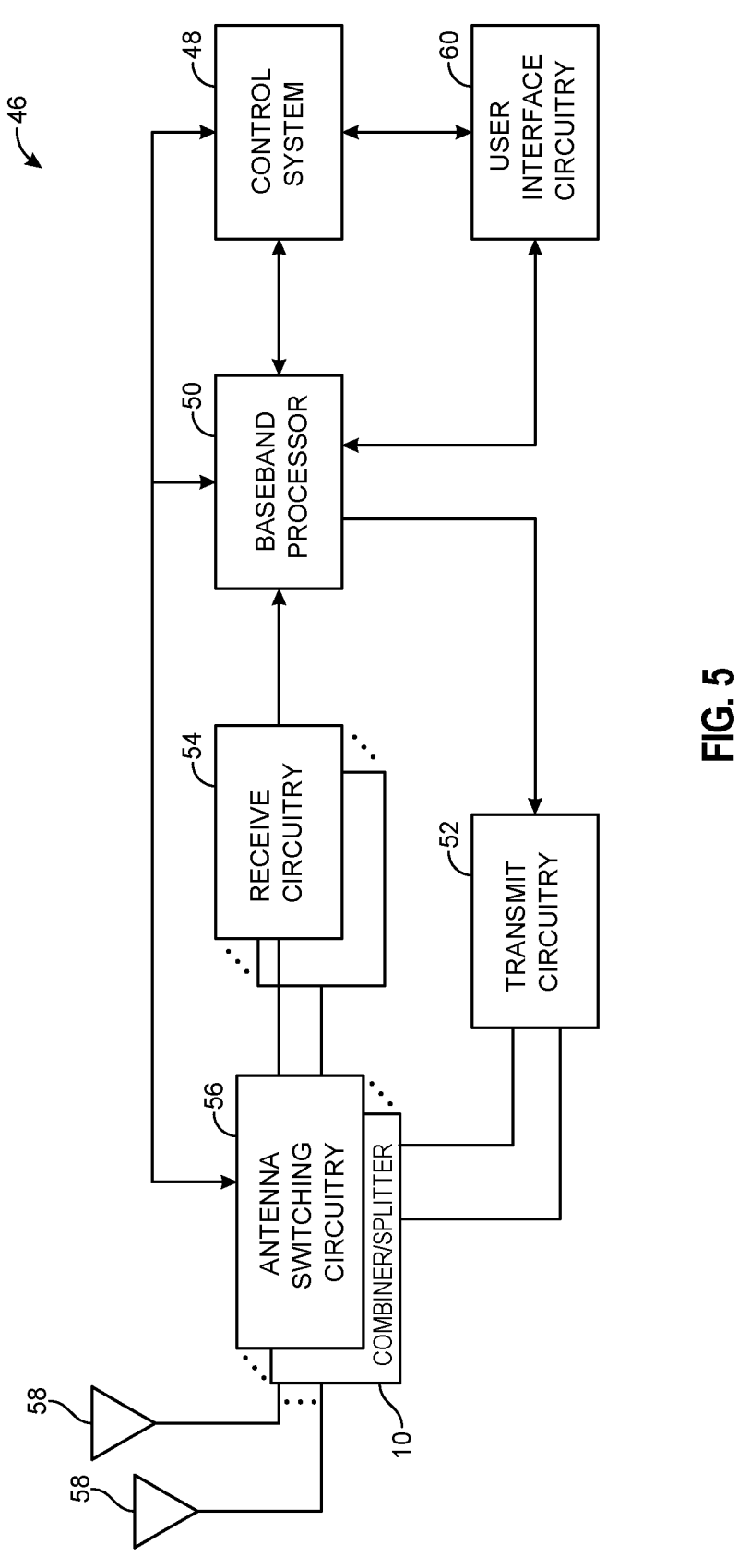
FIG. 5 is a diagram showing how the disclosed combiner/splitter may interact with user elements such as wireless communication devices.

FIG. 5 is a diagram showing how the disclosed combiner/splitter 10 may interact with user elements such as wireless communication devices. With reference to FIG. 5, the concepts described above may be implemented in various types of wireless communication devices or user elements 46, such as mobile terminals, smart watches, tablets, computers, navigation devices, access points, and the like that support wireless communications, such as cellular, wireless local area network (WLAN), Bluetooth, and near-field communications. The user elements 46 generally include a control system 48, a baseband processor 50, transmit circuitry 52, receive circuitry 54, antenna switching circuitry 56, multiple antennas 58, and user interface circuitry 60 that includes the combiner/splitter 10 (FIG. 2). The receive circuitry 54 receives radio frequency signals via the antennas 58 and through the antenna switching circuitry 56 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 50 processes the digitized received signal to extract the information or data bits conveyed in the received signal. This processing typically comprises demodulation, decoding, and error correction operations. The baseband processor 50 is generally implemented in one or more digital signal processors and application-specific integrated circuits.

For transmission, the baseband processor 50 receives digitized data, which may represent voice, data, or control information, from the control system 48, which it encodes for transmission. The encoded data is output to the transmit circuitry 52, where it is used by a modulator to modulate a carrier signal that is at a desired transmit frequency or frequencies. A power amplifier will amplify the modulated carrier signal to a level appropriate for transmission and deliver the modulated carrier signal to the antennas 58 through the antenna switching circuitry 56. The antennas 58 and the replicated transmit circuitry 52 and receive circuitry 52 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A combiner/splitter (10) comprising:
   a first trifilar transformer (12) having a first outer transmission element (14) electrically connected between a first port node (P1) and a first intermediate node (N1);
   a second trifilar transformer (16) having a second outer transmission element (18) electrically connected between the first intermediate node (N1) and a second port node (P2);
   a third trifilar transformer (20) having a third outer transmission element (22) electrically connected between the first port node (P1) and a second intermediate node (N2);
   a fourth trifilar transformer (24) having a fourth outer transmission element (26) electrically connected between the second intermediate node (N2) and a third port node (P3), wherein the second port node P2 and the third port node P3 are different nodes through which different signals from different external sources can be received, and each of the first trifilar transformer (12), the second trifilar transformer (16), the third trifilar transformer (20), and the fourth trifilar transformer (24) is configured to utilize magnetic coupling to perform impedance transformations; and
   a resistor (R1) and a capacitor (C1) electrically connected in series between the second port node (P2) and the third port node (P3) to increase isolation between the second port node (P2) and the third port node (P3).

2. The combiner/splitter (10) of claim 1, wherein the first trifilar transformer (10) comprises a first middle transmission element (28) and a first inner transmission element (30) that are electrically connected in series between the first intermediate node (N1) and a fixed voltage node (G1), wherein the first middle transmission element (28) is arranged relative to the first outer transmission element (14) to magnetically couple with the first outer transmission element (14), and the first inner transmission element (30) is arranged relative to the first middle transmission element (28) to magnetically couple with the first middle transmission element (28).

3. The combiner/splitter (10) of claim 2, wherein the second trifilar transformer (16) comprises a second middle transmission element (32) and a second inner transmission element (34) that are electrically connected in series between the first intermediate node (N1) and the fixed voltage node (G1), wherein the second middle transmission element (32) is arranged relative to the second outer transmission element (18) to magnetically couple with the second outer transmission element (18), and the second inner transmission element (34) is arranged relative to the second middle transmission element (32) to magnetically couple with the second middle transmission element (32).

4. The combiner/splitter (10) of claim 3, wherein the third trifilar transformer (20) comprises a third middle transmission element (36) and a third inner transmission element (38) that are electrically connected in series between the second intermediate node (N2) and the fixed voltage node (G1), wherein the third middle transmission element (36) is arranged relative to the third outer transmission element (22) to magnetically couple with the third outer transmission element (22), and the third inner transmission element (38) is arranged relative to the third middle transmission element (36) to magnetically couple with the third middle transmission element (36).

5. The combiner/splitter (10) of claim 4, wherein the fourth trifilar transformer (20) comprises a fourth middle transmission element (40) and a fourth inner transmission element (42) that are electrically connected in series between the second intermediate node (N2) and the fixed voltage node (G1), wherein the fourth middle transmission element (40) is arranged relative to the fourth outer transmission element (26) to magnetically couple with the fourth outer transmission element (26), and the fourth inner transmission element (42) is arranged relative to the fourth middle transmission element (40) to magnetically couple with the fourth middle transmission element (40).

6. The combiner/splitter of claim 1 further comprising a resistor (R2) electrically connected between the first intermediate node (N1) and the second intermediate node (N2).

7. The combiner/splitter of claim 1 further comprising a capacitor (C2) electrically connected between the first port node (P1) and the fixed voltage node (G1).

8. The combiner/splitter of claim 1 further comprising a capacitor (C3) electrically connected between the first intermediate node (N1) and the fixed voltage node (G1).

9. The combiner/splitter of claim 1 further comprising a capacitor (C4) electrically connected between the second port node (P2) and the fixed voltage node (G1).

10. The combiner/splitter of claim 1 further comprising a capacitor (C5) electrically connected between the second intermediate node (N2) and the fixed voltage node (G1).

11. The combiner/splitter of claim 1 further comprising a capacitor (C6) electrically connected between the third port node (P3) and the fixed voltage node (G1).

12. The combiner/splitter of claim 1 wherein the fixed voltage node is ground.

13. A wireless communication device comprising:
a plurality of antennas;
a baseband processor;
transmit circuitry configured to receive encoded data from the baseband processor and to modulate a carrier signal with the encoded data; and
a combiner/splitter coupled between the plurality of antennas and the transmitter circuitry, the combiner/splitter comprising:
a first trifilar transformer (12) having a first outer transmission element (14) electrically connected between a first port node (P1) and a first intermediate node (N1);
a second trifilar transformer (16) having a second outer transmission element (18) electrically connected between the first intermediate node (N1) and a second port node (P2);
a third trifilar transformer (20) having a third outer transmission element (22) electrically connected between the first port node (P1) and a second intermediate node (N2);

a fourth trifilar transformer (24) having a fourth outer transmission element (26) electrically connected between the second intermediate node (N2) and a third port node (P3), wherein the second port node P2 and the third port node P3 are different nodes through which different signals from different external sources can be received, and each of the first trifilar transformer (12), the second trifilar transformer (16), the third trifilar transformer (20), and the fourth trifilar transformer (24) is configured to utilize magnetic coupling to perform impedance transformations; and
a resistor (R1) and a capacitor (C1) electrically connected in series between the second port node (P2) and the third port node (P3) to increase isolation between the second port node (P2) and the third port node (P3).

14. The wireless communication device of claim 13, wherein the first trifilar transformer (10) comprises a first middle transmission element (28) and a first inner transmission element (30) that are electrically connected in series between the first intermediate node (N1) and a fixed voltage node (G1), wherein the first middle transmission element (28) is arranged relative to the first outer transmission element (14) to magnetically couple with the first outer transmission element (14), and the first inner transmission element (30) is arranged relative to the first middle transmission element (28) to magnetically couple with the first middle transmission element (28).

15. The wireless communication device of claim 14, wherein the second trifilar transformer (16) comprises a second middle transmission element (32) and a second inner transmission element (34) that are electrically connected in series between the first intermediate node (N1) and the fixed voltage node (G1), wherein the second middle transmission element (32) is arranged relative to the second outer transmission element (18) to magnetically couple with the second outer transmission element (18), and the second inner transmission element (34) is arranged relative to the second middle transmission element (32) to magnetically couple with the second middle transmission element (32).

16. The wireless communication device of claim 15, wherein the third trifilar transformer (20) comprises a third middle transmission element (36) and a third inner transmission element (38) that are electrically connected in series between the second intermediate node (N2) and the fixed voltage node (G1), wherein the third middle transmission element (36) is arranged relative to the third outer transmission element (22) to magnetically couple with the third outer transmission element (22), and the third inner transmission element (38) is arranged relative to the third middle transmission element (36) to magnetically couple with the third middle transmission element (36).

17. The wireless communication device of claim 16, wherein the fourth trifilar transformer (20) comprises a fourth middle transmission element (40) and a fourth inner transmission element (42) that are electrically connected in series between the second intermediate node (N2) and the fixed voltage node (G1), wherein the fourth middle transmission element (40) is arranged relative to the fourth outer transmission element (26) to magnetically couple with the fourth outer transmission element (26), and the fourth inner transmission element (42) is arranged relative to the fourth middle transmission element (40) to magnetically couple with the fourth middle transmission element (40).

18. The wireless communication device of claim 13 further comprising a resistor (R2) electrically connected between the first intermediate node (N1) and the second intermediate node (N2).

19. The wireless communication device of claim 13 further comprising a capacitor (C2) electrically connected between the first port node (P1) and the fixed voltage node (G1).

20. The wireless communication device of claim 13 further comprising a capacitor (C3) electrically connected between the first intermediate node (N1) and the fixed voltage node (G1).

21. The wireless communication device of claim 13 further comprising a capacitor (C4) electrically connected between the second port node (P2) and the fixed voltage node (G1).

22. The wireless communication device of claim 13 further comprising a capacitor (C5) electrically connected between the second intermediate node (N2) and the fixed voltage node (G1).

23. The wireless communication device of claim 13 further comprising a capacitor (C6) electrically connected between the third port node (P3) and the fixed voltage node (G1).

* * * * *